(12) United States Patent
Jinzai

(10) Patent No.: US 7,839,708 B2
(45) Date of Patent: Nov. 23, 2010

(54) SEMICONDUCTOR APPARATUS AND TESTING METHOD USING DIFFERENT INTERNAL VOLTAGES TO OUTPUT BINARY SIGNALS

(75) Inventor: Takao Jinzai, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 253 days.

(21) Appl. No.: 11/662,705

(22) PCT Filed: Jun. 27, 2006

(86) PCT No.: PCT/JP2006/313203

§ 371 (c)(1),
(2), (4) Date: May 21, 2007

(87) PCT Pub. No.: WO2007/010734

PCT Pub. Date: Jan. 25, 2007

(65) Prior Publication Data

US 2008/0100424 A1 May 1, 2008

(30) Foreign Application Priority Data

Jul. 21, 2005 (JP) .............................. 2005-211518

(51) Int. Cl.
*G11C 29/00* (2006.01)

(52) U.S. Cl. .................. 365/201; 365/226; 365/189.11; 365/189.05

(58) Field of Classification Search ................ 365/201, 365/226, 189.11; 340/572.1–572.9
See application file for complete search history.

(56) References Cited

U.S. PATENT DOCUMENTS

| | | | |
|---|---|---|---|
| 4,751,682 A | 6/1988 | Matsuoka et al. | |
| 5,400,290 A * | 3/1995 | Suma et al. | 365/226 |
| 6,104,291 A | 8/2000 | Beauvillier et al. | |
| 6,130,602 A * | 10/2000 | O'Toole et al. | 340/10.33 |
| 6,339,357 B1 * | 1/2002 | Yamasaki et al. | 327/538 |
| 6,412,086 B1 * | 6/2002 | Friedman et al. | 714/733 |
| 6,424,263 B1 * | 7/2002 | Lee et al. | 340/572.7 |
| 7,279,920 B2 * | 10/2007 | Kramer | 324/765 |
| 2002/0153997 A1 | 10/2002 | Nakane et al. | |
| 2006/0125505 A1 | 6/2006 | Glidden et al. | |

(Continued)

FOREIGN PATENT DOCUMENTS

EP   1 251 458   10/2002

(Continued)

OTHER PUBLICATIONS

First Office Action of Chinese Application No. 200680000881.0 dated Aug. 8, 2008 (8 pages).

*Primary Examiner*—Tuan T Nguyen
*Assistant Examiner*—R Lance Reidlinger
(74) *Attorney, Agent, or Firm*—Dickstein Shapiro LLP

(57) ABSTRACT

A semiconductor apparatus, configured to operate on different internal voltages generated from electromagnetic waves received via an antenna, to extract a command and data from the received electromagnetic waves, and to operate according to the extracted command, includes internal circuitry configured to generate and output binary signals according to a command input from the outside in a test operation for performing a predetermined test; and output circuits corresponding to some or all of the internal voltages and configured to convert the binary signals output from the internal circuitry into binary signals having same voltages as the corresponding internal voltages and to output the converted binary signals to the outside.

9 Claims, 4 Drawing Sheets

U.S. PATENT DOCUMENTS

2006/0138653 A1 * 6/2006 Miwa et al. .................. 257/728

FOREIGN PATENT DOCUMENTS

| | | |
|---|---|---|
| EP | 1 596 324 | 11/2005 |
| JP | 61-207030 | 9/1986 |
| JP | 06-194424 | 7/1994 |
| JP | 11-066890 | 3/1999 |
| WO | WO 01/92902 | 12/2001 |

* cited by examiner

US 7,839,708 B2

SEMICONDUCTOR APPARATUS AND TESTING METHOD USING DIFFERENT INTERNAL VOLTAGES TO OUTPUT BINARY SIGNALS

TECHNICAL FIELD

The present invention generally relates to a semiconductor apparatus and a method of testing a semiconductor apparatus, and more particularly relates to a semiconductor apparatus which operates on electricity supplied by received electromagnetic waves, for example an ID tag using an RFID chip, and a method of testing such a semiconductor apparatus.

BACKGROUND ART

FIG. 3 is a block diagram illustrating an exemplary internal configuration of a conventional semiconductor apparatus.

A semiconductor apparatus 100 shown in FIG. 3 functions as an ID tag and includes a semiconductor chip 101 which functions as an RFID chip. The semiconductor apparatus 100 operates on electricity supplied by electromagnetic waves received by an antenna 102. The electromagnetic waves received by the antenna 102 are rectified by a rectifying circuit (not shown) in analog circuitry 111. An internal voltage generating circuit 121, which functions as a voltage regulator, generates different constant voltages, an internal voltage VCC and an internal voltage VDD, from a voltage obtained by rectification. The internal voltage VCC provides electricity for the analog circuitry 111; and the internal voltage VDD provides electricity for memory circuitry 113, digital circuitry 112 for controlling the operation of the memory circuitry 113, and I/O cells 114 through 117.

The semiconductor chip 101 includes pads Pvcc and Pvdd used for checking the internal voltages VCC and VDD generated in the semiconductor chip 101 from the outside. The internal voltage VCC is applied to the pad Pvcc, and the internal voltage VDD is applied to the pad Pvdd.

FIG. 4 is a block diagram illustrating another exemplary internal configuration of the semiconductor apparatus 100. The internal configuration shown in FIG. 4 differs from that shown in FIG. 3 in that a selection circuit 125 is added. Both the internal voltages VCC and VDD are input into the selection circuit 125. The selection circuit 125 outputs either the internal voltage VCC or VDD to a pad Pv according to a control signal Sc input via a pad Psc from the outside.

Patent document 1 discloses a core LSI created with a core CPU and prepared cell libraries according to a gate array or standard cell approach. Patent document 2 discloses a semiconductor integrated circuit apparatus the configuration of which makes it possible to accurately and easily test its internal voltages without increasing its consumption current and the number of pads.

[Patent document 1] Japanese Patent Application Publication No. 61-207030

[Patent document 2] Japanese Patent Application Publication No. 11-66890

However, in a conventional apparatus such as the semiconductor apparatus 100, each pad may have a size of, for example, 100 μm square where the semiconductor chip 101 has a size of 2 mm square. Since pads occupy much space on the semiconductor chip 101, it is necessary to reduce the number of pads to reduce the size of the semiconductor chip 101 and thereby reduce the production costs.

DISCLOSURE OF THE INVENTION

The present invention provides a semiconductor apparatus and a method of testing a semiconductor apparatus that substantially obviate one or more problems caused by the limitations and disadvantages of the related art. An embodiment of the present invention particularly provides a semiconductor apparatus in which pads dedicated to determining whether the internal voltages VCC and VDD are within a specification are omitted to reduce the size of a semiconductor chip and thereby reduce the production costs, and a method of testing such a semiconductor apparatus.

According to an embodiment of the present invention, a semiconductor apparatus, configured to operate on different internal voltages generated from electromagnetic waves received via an antenna, to extract a command and data from the received electromagnetic waves, and to operate according to the extracted command, includes internal circuitry configured to generate and output binary signals according to the command input from the outside in a test operation for performing a predetermined test; and output circuits corresponding to some or all of the internal voltages and configured to convert the binary signals output from the internal circuitry into binary signals having same voltages as the corresponding internal voltages and to output the converted binary signals to the outside.

Each of the output circuits may be implemented with an I/O cell which operates on the corresponding internal voltage.

According to an aspect of the present invention, the semiconductor apparatus further includes one or more input circuits each of which, in the test operation, receives a command and data input from the outside and outputs the command and the data to the internal circuitry.

According to an aspect of the present invention, the internal circuitry in the semiconductor apparatus includes analog circuitry which generates different internal voltages from electromagnetic waves received from the antenna, detects the received electromagnetic waves, and extracts the command and data from the received electromagnetic waves; memory circuitry implemented with a non-volatile memory; and digital circuitry which reads data from the memory circuitry and writes data into the memory circuitry according to the command extracted by the analog circuitry.

According to an aspect of the present invention, the digital circuitry in the semiconductor apparatus, in the test operation, reads data from the memory circuitry and writes data into the memory circuitry according to the command input from one of the input circuits, and outputs the data read from the memory circuitry to the output circuits.

According to an aspect of the present invention, the analog circuitry in the semiconductor apparatus includes a rectifying circuit which rectifies electromagnetic waves received via the antenna; an internal voltage generating circuit which generates the internal voltages from signals obtained by rectifying the received electromagnetic waves and outputs the generated internal voltages; and a detecting circuit which detects the received electromagnetic waves and extracts a command and data from the received electromagnetic waves, and outputs the extracted command and data to the digital circuitry.

The internal circuitry, the output circuits, and the input circuits may be integrated on one semiconductor chip.

The semiconductor chip may include a pair of connecting terminals for connecting the antenna; test output terminals corresponding to the output circuits; and test input terminals corresponding to the input circuits.

The antenna and the internal circuitry in the semiconductor chip may function as an ID tag.

According to an embodiment of the present invention, a method of testing a semiconductor apparatus, configured to operate on different internal voltages generated from electromagnetic waves received via an antenna from the outside, to extract a command and data from the received electromagnetic waves, and to operate according to the extracted command, includes the steps of generating and outputting binary signals according to the extracted command; converting the generated binary signals into binary signals having same voltages as the internal voltages; outputting the converted binary signals to the outside; detecting an error in internal operation of the semiconductor apparatus based on the output binary signals; and detecting an abnormal internal voltage by measuring the voltages of the output binary signals.

In a semiconductor apparatus according to an embodiment of the present invention, the output circuits convert the binary signals output from the internal circuitry into binary signals having the same voltages as the internal voltages and output the converted binary signals to the outside. Therefore, it is possible to detect an error in internal operation based on the output binary signals and to detect an abnormal internal voltage by measuring the voltages of the output binary signals. Such a configuration eliminates a need for dedicated terminals for measuring the internal voltages and makes it possible to reduce the number of terminals in a semiconductor chip, thereby reducing the size of the semiconductor chip and reducing the production costs.

In a method of testing a semiconductor apparatus according to an embodiment of the present invention, binary signals are generated according to a command from outside the semiconductor apparatus, the generated binary signals are converted into binary signals having the same voltages as the internal voltages of the semiconductor apparatus, and the converted binary signals are output to the outside. Therefore, it is possible to detect an error in internal operation of the semiconductor apparatus based on the output binary signals and to detect an abnormal internal voltage by measuring the voltages of the output binary signals. Such a method eliminates a need for dedicated terminals for measuring the internal voltages of a semiconductor apparatus and makes it possible to reduce the number of terminals in a semiconductor chip, thereby reducing the size of the semiconductor chip and reducing the production costs.

BEST MODE FOR CARRYING OUT THE INVENTION

A preferred embodiment of the present invention is described below with reference to accompanying drawings.

Figure 1:
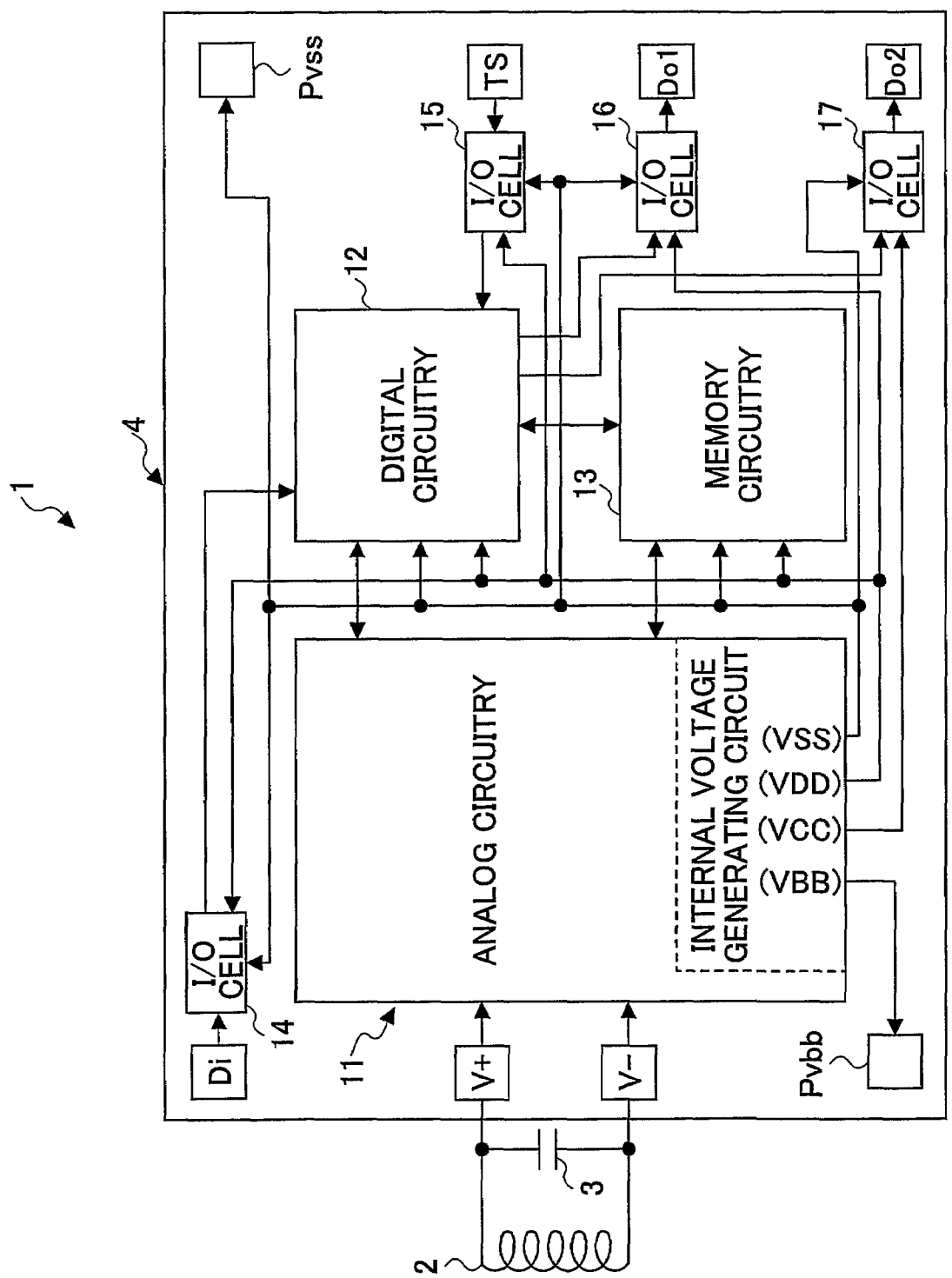
FIG. 1 is a block diagram illustrating an exemplary configuration of a semiconductor apparatus according to an embodiment of the present invention.

FIG. 1 is a block diagram illustrating an exemplary configuration of a semiconductor apparatus according to an embodiment of the present invention.

A semiconductor apparatus 1 shown in FIG. 1 functions as an ID tag and includes an antenna 2, a condenser 3, and a semiconductor chip 4 which functions as an RFID chip.

The semiconductor chip 4 includes analog circuitry 11, digital circuitry 12, memory circuitry 13 implemented with a non-volatile memory such as an EEPROM, I/O cells 14 through 17, and eight pads V+, V−, Di, Pvbb, Pvss, TS, Do1, and Do2. The I/O cells 14 and 15 function as input circuits; and the I/O cells 16 and 17 function as output circuits.

Between the pads V+ and V−, the antenna 2 and the condenser 3 are connected in parallel. The pads V+ and V− are connected to the analog circuitry 11. The pad Di is connected via the I/O cell 14 to the digital circuitry 12; and the pad TS is connected via the I/O cell 15 to the digital circuitry 12. The digital circuitry 12 is connected via the I/O cell 16 to the pad Do1 and connected via the I/O cell 17 to the pad Do2. The analog circuitry 11 is connected to the digital circuitry 12 and the memory circuitry 13; and the digital circuitry 12 is connected to the memory circuitry 13.

The analog circuitry 11 generates predetermined constant voltages, internal voltages VDD and VCC, from a voltage VBB obtained by rectifying the signals received by the antenna 2. The analog circuitry 11 supplies the generated internal voltage VDD to the digital circuitry 12, the memory circuitry 13, and the I/O cells 14 through 16. On the other hand, the analog circuitry 11 supplies the generated internal voltage VCC to the I/O cell 17. The analog circuitry 11 also generates from the generated internal voltage VCC another voltage necessary to write data into the memory circuitry 13, and supplies that voltage to the memory circuitry 13. Further, the analog circuitry 11 generates a ground voltage VSS, and applies the voltage VSS to the digital circuitry 12, the memory circuitry 13, the I/O cells 14 through 17, and the pad Pvss. Also, the analog circuitry 11 detects the signals received by the antenna 2, extracts data from the signals, and outputs the extracted data to the digital circuitry 12. The digital circuitry 12 controls the operation of the memory circuitry 13 according to the input data.

Figure 2:
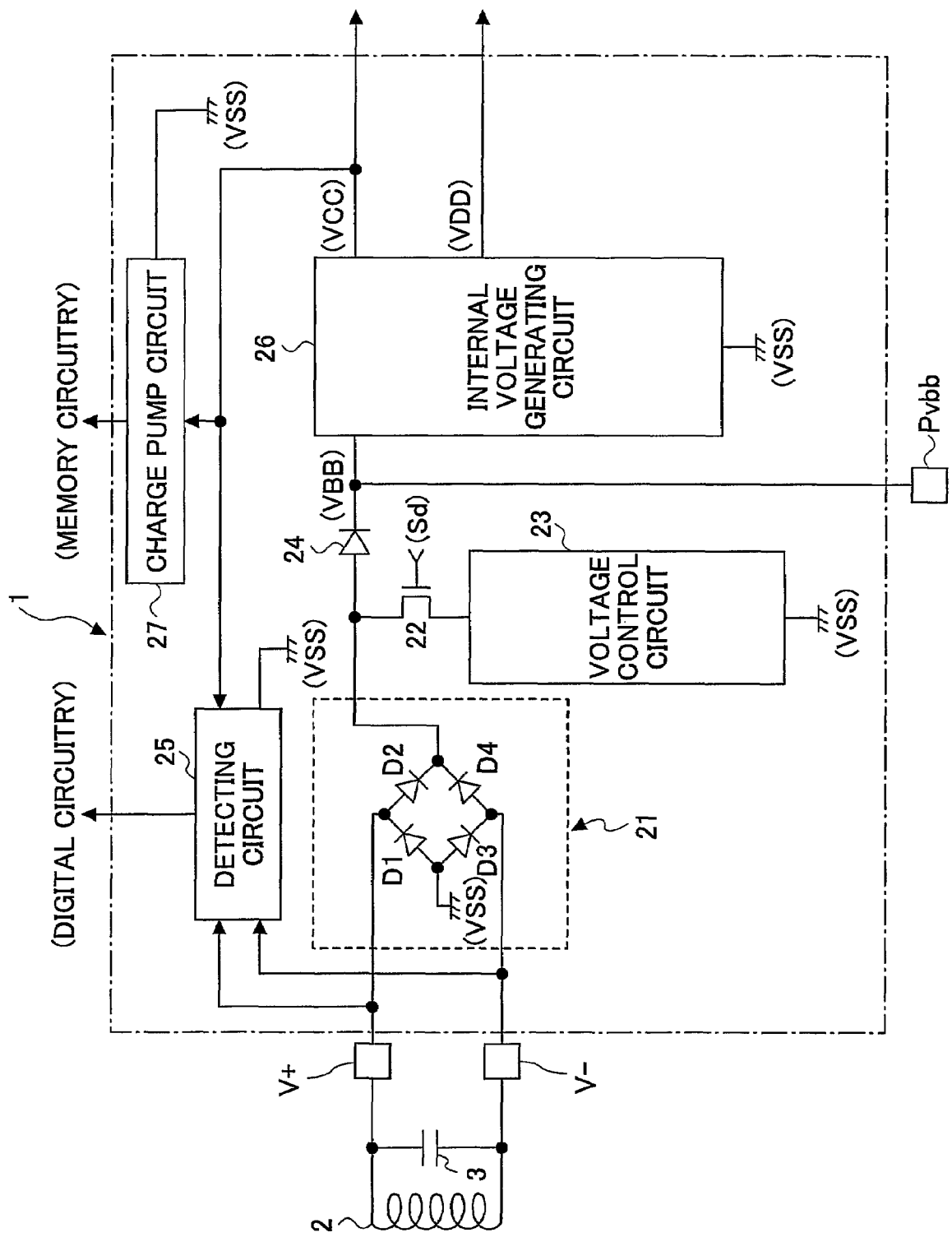
FIG. 2 is a circuit diagram illustrating an exemplary internal configuration of analog circuitry 11 shown in FIG. 1.
Figure 3:
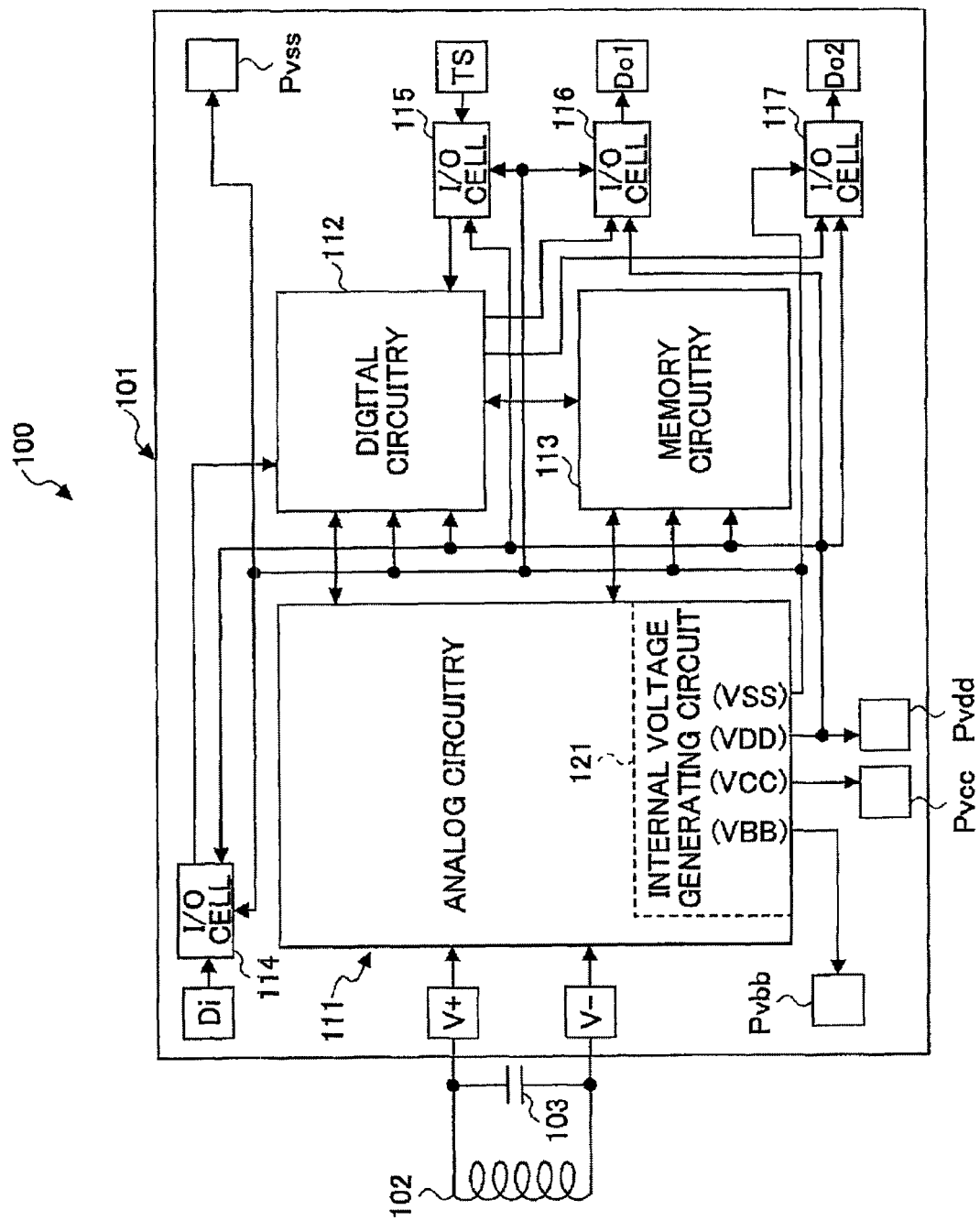
FIG. 3 is a block diagram illustrating an exemplary internal configuration of a conventional semiconductor apparatus.
Figure 4:
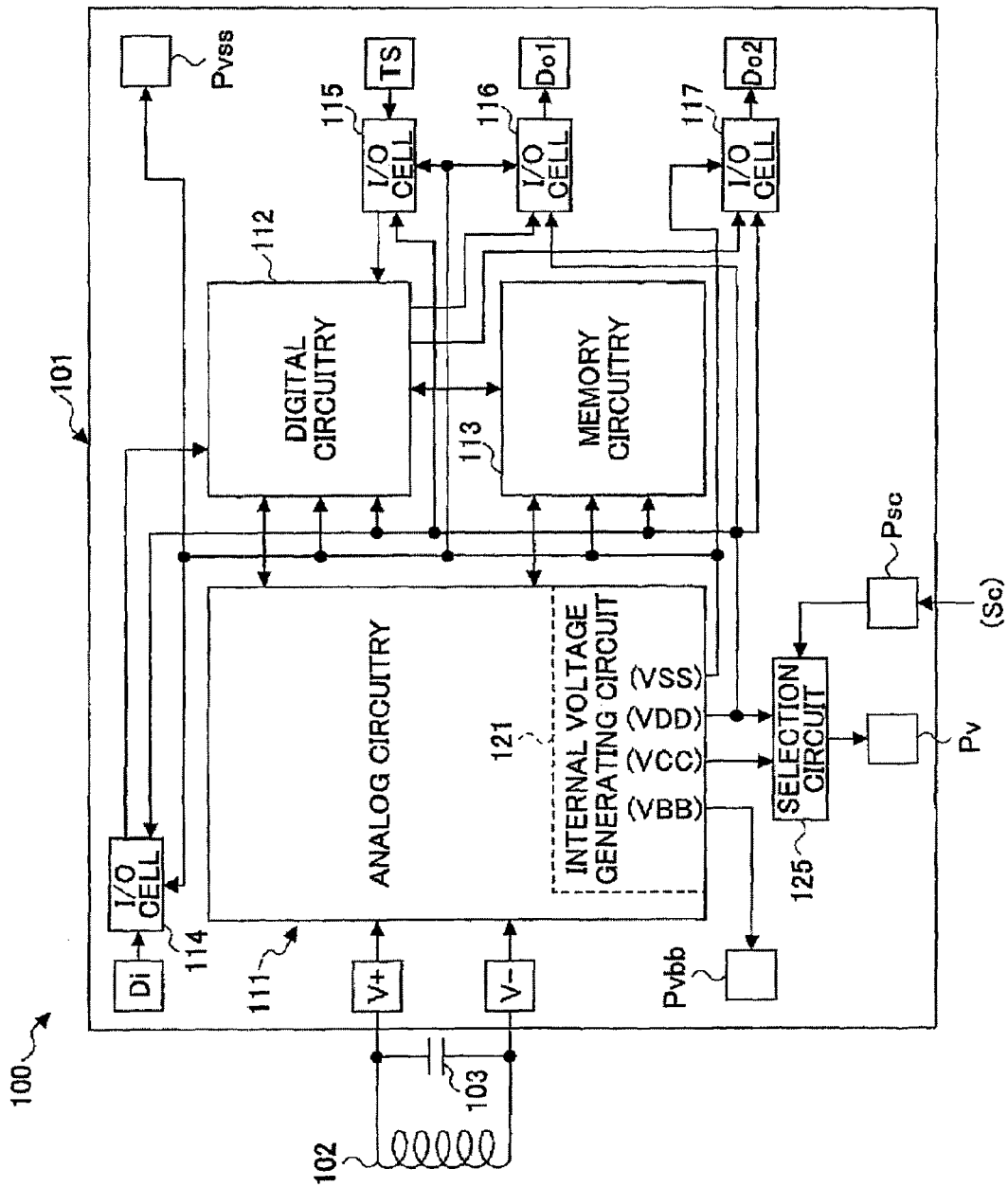
FIG. 4 is a block diagram illustrating another exemplary internal configuration of a conventional semiconductor apparatus.

FIG. 2 is a circuit diagram illustrating an exemplary internal configuration of the analog circuitry 11.

The analog circuitry 11 shown in FIG. 2 includes a rectifying circuit 21, an NMOS transistor 22 which functions as a load switch, a voltage control circuit 23, a reverse current blocking diode 24, a detecting circuit 25, an internal voltage generating circuit 26 which functions as a voltage regulator, and a charge pump circuit 27.

The rectifying circuit 21 rectifies signals received by the antenna 2 and is made up of bridge-connected diodes D1 through D4. The anodes of the diodes D1 and D3 are connected and the connection point is connected to the ground voltage VSS. The connection point connecting the cathode of the diode D1 and the anode of the diode D2 is connected to the pad V+. The connecting point connecting the cathode of the diode D3 and the anode of the diode D4 is connected to the pad V−. The connecting point connecting cathodes of the diodes D2 and D4 is the output end of the rectifying circuit 21. Signals rectified by the rectifying circuit 21 are input via the reverse current blocking diode 24 into the internal voltage generating circuit 26 as the voltage VBB, and the voltage VBB is applied to the pad Pvbb.

The NMOS transistor 22 and the voltage control circuit 23 are connected between the output end of the rectifying circuit 21 and the ground voltage VSS. A control signal Sd is input from the digital circuitry 12 into the gate of the NMOS transistor 22. The NMOS transistor 22 switches according to the control signal Sd. The internal voltage generating circuit 26 generates predetermined internal voltages VCC and VDD from the input voltage VBB. The internal voltage generating circuit 26 supplies the internal voltage VCC to the detecting circuit 25 and the I/O cell 17. The internal voltage generating circuit 26 also inputs the internal voltage VCC to the charge pump circuit 27. As described above, the digital circuitry 12, the memory circuitry 13, and the I/O cells 14 through 16 operate on the internal voltage VDD generated by the internal voltage generating circuit 26. The detecting circuit 25 is connected to the pads V+ and V−. The detecting circuit 25 extracts data from the signals input from the antenna 2 and outputs the data to the digital circuitry 12.

In normal operations, the pads TS and Di are pulled down and therefore are at low levels. The digital circuitry 12 controls the operation of the memory circuitry 13 according to a command contained in the signals input from the detecting circuit 25: the digital circuitry 12 either writes data, which are contained in the signals input from the detecting circuit 25, into the memory circuitry 13; or reads out data written in the memory circuitry 13. The charge pump circuit 27 supplies the memory circuitry 13 with the voltage necessary to write data.

When transmitting data read out from the memory circuitry 13 to the outside, the digital circuitry 12 switches the NMOS transistor 22 according to the data, and thereby transmits the data from the antenna 2. The voltage control circuit 23 controls the current flowing through the NMOS transistor 22 when the NMOS transistor 22 is on, thereby preventing the output voltage of the rectifying circuit 21 from becoming smaller than a predetermined voltage. When the pad TS is at a low level, the digital circuitry 12 outputs data to the I/O cells 16 and 17 to keep the pads Do1 and Do2 at high levels.

When a test for the semiconductor chip 4 is performed, electromagnetic waves not containing data are transmitted to the antenna 2 and high level signals are input to the pad TS from the outside. The internal voltage generating circuit 26 generates the internal voltages VCC and VDD from the voltage VBB output from the rectifying circuit 21, and outputs those internal voltages. When high level signals are input to the pad TS, the digital circuitry 12 ignores the data signals from the detecting circuit 25; and, according to a command input from the outside to the pad Di, writes data input to the pad Di into the memory circuitry 13, reads out the data from the memory circuitry 13, and outputs the read out data to the I/O cells 16 and 17. The I/O cell 16 outputs the input data to the pad Do1; the I/O cell 17 outputs the input data to the pad Do2. Therefore, it is possible to test the operation of circuits in the semiconductor chip 4 by inputting data signals to the pad Di and detecting output signals from the pads Do1 and Do2.

The I/O cell 16 operates on the internal voltage VDD and the I/O cell 17 operates on the internal voltage VCC. Accordingly, the high level signals output from the I/O cell 16 have the same voltage as the internal voltage VDD, and the high level signals output from the I/O cell 17 have the same voltage as the internal voltage VCC. (The I/O cell 16 converts the input data into high level signals having the same voltage as the internal voltage VDD, and the I/O cell 17 converts the input data into high level signals having the same voltage as the internal voltage VCC.) Therefore, a test for determining whether the internal voltages VCC and VDD are within specification can be performed by measuring the voltages of the pads Do1 and Do2 when high level signals are output from the I/O cells 16 and 17.

As described above, a semiconductor apparatus according to an embodiment of the present invention does not require dedicated pads for measuring the internal voltages VCC and VDD. Such a configuration of a semiconductor apparatus makes it possible to reduce the number of pads in a semiconductor chip, thereby reducing the size of a semiconductor chip and reducing the production costs.

The present invention is not limited to the specifically disclosed embodiments, and variations and modifications may be made without departing from the scope of the present invention.

The present application is based on Japanese Priority Application No. 2005-211518, filed on Jul. 21, 2005, the entire contents of which are hereby incorporated herein by reference.

The invention claimed is:

1. A semiconductor apparatus configured to operate on a plurality of internal voltages generated from electromagnetic waves received via an antenna, to extract a command and data from the received electromagnetic waves, and to operate according to the extracted command, comprising:
    internal circuitry configured to perform a predetermined test by generating and outputting binary signals according to a command input from outside, wherein the command input includes;
        inputting high level signals to a first input circuit from the outside to cause the internal circuitry to ignore data signals from a detecting circuit;
        inputting a command from the outside to a second input circuit to write data into a memory circuit of the internal circuitry; and
    output circuits each corresponding to a distinct internal voltage of the plurality of internal voltages generated from the electromagnetic waves and configured to convert the binary signals output from the internal circuitry and the memory circuit into binary signals having same voltages as the corresponding internal voltages and wherein data output from the memory circuit during the predetermined test is output to a first and second output circuit.

2. The semiconductor apparatus as claimed in claim 1, wherein each of the output circuits is implemented with an I/O cell which operates on the corresponding internal voltage.

3. The semiconductor apparatus as claimed in claim 1, wherein the internal circuitry includes:
    analog circuitry which generates a plurality of internal voltages from electromagnetic waves received from the antenna, and detects the received electromagnetic waves and extracts the command and the data from the received electromagnetic waves;
    the memory circuit implemented with a non-volatile memory; and
    digital circuitry which reads the data from the memory circuitry and writes the data into the memory circuitry according to the command extracted by the analog circuitry.

4. The semiconductor apparatus as claimed in claim 3, wherein the digital circuitry, in the test operation, reads the data from the memory circuitry and writes the data into the memory circuitry according to the command input from one of the input circuits.

5. The semiconductor apparatus as claimed in claim 3, wherein the analog circuitry includes a rectifying circuit which rectifies electromagnetic waves received via the antenna;
    an internal voltage generating circuit which generates the internal voltages from signals obtained by rectifying the received electromagnetic waves and outputs the generated internal voltages; and a detecting circuit which detects the received electromagnetic waves and extracts the command and the data from the received electromagnetic waves, and outputs the extracted command and data to the digital circuitry.

6. The semiconductor apparatus as claimed in claim 1, wherein the internal circuitry, the output circuits, and the input circuits are integrated on one semiconductor chip.

7. The semiconductor apparatus as claimed in claim 6, wherein the semiconductor chip includes a pair of connecting terminals for connecting the antenna;

test output terminals corresponding to the output circuits; and test input terminals corresponding to the input circuits.

8. The semiconductor apparatus as claimed in claim 1, wherein the antenna and the internal circuitry form an ID tag.

9. A method of testing a semiconductor apparatus configured to operate on a plurality of internal voltages generated from electromagnetic waves received via an antenna, to extract a command and data from the received electromagnetic waves, and to operate according to the extracted command, comprising the steps of:

receiving electromagnetic dataless waves at an antenna;

ignoring data signals from a detecting circuit in response to a high level signal input to a first input circuit;

receiving a command from the outside to a second input circuit to write data into a memory circuit of the internal circuitry;

generating and outputting binary signals according to the command input from outside to the second input circuit;

converting the generated binary signals into binary signals having same voltages as the internal voltages;

outputting the converted binary signals to the outside to first and second output circuits each corresponding to a distinct internal voltage of the plurality of internal voltages generated from the electromagnetic waves;

detecting an error in internal operation of the semiconductor apparatus based on the output binary signals; and detecting an abnormal internal voltage by measuring the voltages of the output binary signals.

* * * * *